(12) United States Patent
Kim et al.

(10) Patent No.: US 7,904,792 B2
(45) Date of Patent: Mar. 8, 2011

(54) APPARATUS AND METHOD FOR TRANSMITTING/RECEIVING SIGNAL IN A COMMUNICATION SYSTEM

(75) Inventors: Dong-Ho Kim, Seoul (KR); Jaehong Kim, Seoul (KR); Aditya Ramamoorthy, Ames, IA (US); Steven W. McLaughlin, Decatur, GA (US)

(73) Assignees: Samsung Electronics Co., Ltd., Suwon-si (KR); Georgia Tech Research Corporation, Atlanta, GA (US)

( * ) Notice: Subject to any disclaimer, the term of this patent is extended or adjusted under 35 U.S.C. 154(b) by 994 days.

(21) Appl. No.: 11/603,585

(22) Filed: Nov. 22, 2006

(65) Prior Publication Data
US 2007/0226583 A1 Sep. 27, 2007

Related U.S. Application Data

(60) Provisional application No. 60/738,884, filed on Nov. 22, 2005.

(30) Foreign Application Priority Data

Aug. 31, 2006 (KR) ........................ 10-2006-0083834

(51) Int. Cl.
 *H03M 13/35* (2006.01)
(52) U.S. Cl. ...................................... 714/774
(58) Field of Classification Search .................. 714/774
 See application file for complete search history.

(56) References Cited

U.S. PATENT DOCUMENTS

| | | | |
|---|---|---|---|
| 6,381,727 B1 * | 4/2002 | Ikeda | 714/780 |
| 6,516,441 B1 * | 2/2003 | Kim et al. | 714/774 |
| 6,606,724 B1 * | 8/2003 | Krieger et al. | 714/755 |
| 7,000,174 B2 * | 2/2006 | Mantha et al. | 714/790 |
| 7,058,878 B2 * | 6/2006 | Kanaoka et al. | 714/794 |
| 7,173,978 B2 * | 2/2007 | Zhang et al. | 375/298 |
| 7,197,691 B2 * | 3/2007 | Beerel et al. | 714/795 |
| 7,222,284 B2 * | 5/2007 | Stolpman | 714/774 |
| 7,430,705 B2 * | 9/2008 | Uchida | 714/794 |
| 7,702,986 B2 * | 4/2010 | Bjerke et al. | 714/755 |

OTHER PUBLICATIONS

Pishro-Nik et al., Results on Punctured LDPC Codes, Oct. 24, 2004.
Hsu et al., Capacity Achieving LDPC Codes Through Puncturing, 2005 International Conference on Wireless Networks, Communications and Mobile Computing, 2005 IEEE.
Ha et al., Rate-Compatible Puncturing of Low-Density Parity-Check Codes, IEEE Transactions on Information Theory, vol. 50, No. 11, Nov. 2004.
Ha et al., Puncturing for Finite Length Low-Density Parity-Check Codes, 2004 IEEE.

(Continued)

*Primary Examiner* — Stephen M Baker
(74) *Attorney, Agent, or Firm* — NSIP Law (57) ABSTRACT

In a communication system, a signal transmission apparatus includes an encoder for encoding an information vector into a low density parity check (LDPC) codeword with an LDPC coding scheme, and a puncturer for puncturing the LDPC codeword according to a coding rate using a puncturing scheme. A signal reception apparatus includes a '0' inserter for inserting '0' symbols in a received signal according to a coding rate used in a signal transmission apparatus, and a decoder for decoding the '0' symbol-inserted signal with a decoding scheme corresponding to a low density parity check (LDPC) coding scheme used in the signal transmission apparatus, thereby detecting an information vector.

35 Claims, 6 Drawing Sheets

OTHER PUBLICATIONS

Ha et al., Optimal Puncturing of Irregular Low-Density Parity-Check Codes, 2003 IEEE.

Ha et al., Optimal Puncturing Distributions for Rate-Compatible Low-Density Parity-Check Codes, 2003 IEEE.

Ha, Low-Density Parity-Check Codes with Erasures and Puncturing, Nov. 2003.

Hagenauer, Rate-Compatible Puncturing Convolutional Codes (RCPC Codes) and Their Applications, IEEE Transactions on Communications, vol. 36, No. 4, Apr. 1988.

Cain et al., Punctured Convolutional Codes of Rate (n-1)/n and Simplified Maximum Likelihood Decoding, IEEE Transactions on Information Theory, vol. IT-25, No. 1, Jan. 1979.

* cited by examiner

$$H_2 = \left[ \begin{array}{cccccccc|cccc|cc|c|c}
\multicolumn{8}{c|}{P_1} & \multicolumn{4}{c|}{P_2} & \multicolumn{2}{c|}{P_3} & P_4 & P_5 \\
1 & 0 & 0 & 0 & 0 & 0 & 0 & 0 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 \\
0 & 1 & 0 & 0 & 0 & 0 & 0 & 0 & 0 & 0 & 0 & 0 & 0 & 0 & 0 & 0 \\
0 & 1 & 0 & 0 & 0 & 0 & 0 & 0 & 1 & 0 & 0 & 0 & 1 & 0 & 0 & 0 \\
0 & 0 & 1 & 0 & 0 & 0 & 0 & 0 & 0 & 0 & 0 & 0 & 0 & 0 & 0 & 0 \\
0 & 0 & 1 & 0 & 0 & 0 & 0 & 0 & 0 & 1 & 0 & 0 & 0 & 0 & 0 & 0 \\
0 & 0 & 0 & 1 & 0 & 0 & 0 & 0 & 0 & 0 & 0 & 0 & 0 & 0 & 0 & 0 \\
0 & 0 & 0 & 1 & 0 & 0 & 0 & 0 & 0 & 1 & 0 & 0 & 1 & 0 & 1 & 0 \\
0 & 0 & 0 & 0 & 1 & 0 & 0 & 0 & 0 & 0 & 0 & 0 & 0 & 0 & 0 & 0 \\
0 & 0 & 0 & 0 & 1 & 0 & 0 & 0 & 0 & 0 & 1 & 0 & 0 & 0 & 0 & 0 \\
0 & 0 & 0 & 0 & 0 & 1 & 0 & 0 & 0 & 0 & 0 & 0 & 0 & 0 & 0 & 0 \\
0 & 0 & 0 & 0 & 0 & 1 & 0 & 0 & 0 & 0 & 1 & 0 & 0 & 1 & 0 & 0 \\
0 & 0 & 0 & 0 & 0 & 0 & 1 & 0 & 0 & 0 & 0 & 0 & 0 & 0 & 0 & 0 \\
0 & 0 & 0 & 0 & 0 & 0 & 1 & 0 & 0 & 0 & 0 & 1 & 0 & 0 & 0 & 0 \\
0 & 0 & 0 & 0 & 0 & 0 & 0 & 1 & 0 & 0 & 0 & 0 & 0 & 0 & 0 & 0 \\
0 & 0 & 0 & 0 & 0 & 0 & 0 & 1 & 0 & 0 & 0 & 1 & 0 & 1 & 1 & 1 \\
\end{array} \right]$$

FIG.5

$$H_2 = \left[ \begin{array}{cccccccc|cccc|cc|c|c}
\multicolumn{8}{c|}{P_1} & \multicolumn{4}{c|}{P_2} & \multicolumn{2}{c|}{P_3} & P_4 & P_5 \\
1 & 0 & 0 & 0 & 0 & 0 & 0 & 0 & 0 & 0 & 0 & 0 & 0 & 0 & 0 & 0 \\
0 & 1 & 0 & 0 & 0 & 0 & 0 & 0 & 0 & 0 & 0 & 0 & 0 & 0 & 0 & 0 \\
0 & 0 & 1 & 0 & 0 & 0 & 0 & 0 & 0 & 0 & 0 & 0 & 0 & 0 & 0 & 0 \\
0 & 0 & 0 & 1 & 0 & 0 & 0 & 0 & 0 & 0 & 0 & 0 & 0 & 0 & 0 & 0 \\
0 & 0 & 0 & 0 & 1 & 0 & 0 & 0 & 0 & 0 & 0 & 0 & 0 & 0 & 0 & 0 \\
0 & 0 & 0 & 0 & 0 & 1 & 0 & 0 & 0 & 0 & 0 & 0 & 0 & 0 & 0 & 0 \\
0 & 0 & 0 & 0 & 0 & 0 & 1 & 0 & 0 & 0 & 0 & 0 & 0 & 0 & 0 & 0 \\
0 & 0 & 0 & 0 & 0 & 0 & 0 & 1 & 0 & 0 & 0 & 0 & 0 & 0 & 0 & 0 \\
1 & 0 & 0 & 0 & 0 & 0 & 0 & 0 & 1 & 0 & 0 & 0 & 0 & 0 & 0 & 0 \\
0 & 1 & 0 & 0 & 0 & 0 & 0 & 0 & 0 & 1 & 0 & 0 & 0 & 0 & 0 & 0 \\
0 & 0 & 1 & 0 & 0 & 0 & 0 & 0 & 0 & 0 & 1 & 0 & 0 & 0 & 0 & 0 \\
0 & 0 & 0 & 1 & 0 & 0 & 0 & 0 & 0 & 0 & 0 & 1 & 0 & 0 & 0 & 0 \\
0 & 0 & 0 & 0 & 1 & 0 & 0 & 0 & 1 & 0 & 0 & 0 & 1 & 0 & 0 & 0 \\
0 & 0 & 0 & 0 & 0 & 1 & 0 & 0 & 0 & 1 & 0 & 0 & 0 & 1 & 0 & 0 \\
0 & 0 & 0 & 0 & 0 & 0 & 1 & 0 & 0 & 0 & 1 & 0 & 1 & 0 & 1 & 0 \\
0 & 0 & 0 & 0 & 0 & 0 & 0 & 1 & 0 & 0 & 0 & 1 & 0 & 1 & 1 & 1 \\
\end{array} \right]$$

FIG.6

$$H_2 = \begin{bmatrix} 1 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 \\ 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 0 \\ 1 & 0 & 0 & 0 & 0 & 0 & 1 & 0 & 0 & 0 & 0 & 0 \\ 0 & 1 & 0 & 0 & 0 & 0 & 0 & 1 & 0 & 0 & 0 & 0 \\ 0 & 0 & 1 & 0 & 0 & 0 & 0 & 0 & 1 & 0 & 0 & 0 \\ 0 & 0 & 0 & 1 & 0 & 0 & 1 & 0 & 0 & 1 & 0 & 0 \\ 0 & 0 & 0 & 0 & 1 & 0 & 0 & 1 & 0 & 1 & 1 & 0 \\ 0 & 0 & 0 & 0 & 0 & 1 & 0 & 0 & 1 & 0 & 1 & 1 \end{bmatrix}$$

$d = 4$
$\gamma(1) = 6$
$\gamma(2) = 3$
$\gamma(3) = 1$
$\gamma(4) = 1$
$\zeta = 4$

APPARATUS AND METHOD FOR TRANSMITTING/RECEIVING SIGNAL IN A COMMUNICATION SYSTEM

PRIORITY

This application claims the benefit under 35 U.S.C. §119 (a) of a provisional application entitled "Apparatus and Method for Transmitting/Receiving Signal in a Communication System" filed in the United States Patent and Trademark Office on Nov. 22, 2005 and assigned Ser. No. 60/738,884, and an application entitled "Apparatus and Method for Transmitting/Receiving Signal in a Communication System" filed in the Korean Intellectual Property Office on Aug. 31, 2006 and assigned Serial No. 2006-83834, the entire contents of both of which are hereby incorporated by reference.

BACKGROUND OF THE INVENTION

1. Field of the Invention

The present invention relates generally to a communication system, and in particular, to an apparatus and method for transmitting/receiving signal in a communication system.

2. Description of the Related Art

In general, the current wireless communication system is developing into a system for providing the kind of service capable of enabling high-speed, high-capacity data transmission/reception. Therefore, the communication system actively considers the use of Low Density Parity Check (LDPC) codes suitable for the high-speed, high-capacity data transmission/reception.

For a high-speed, high-capacity data transmission/reception protocol, the communication system also positively considers the use of various schemes such as a Hybrid Automatic Retransmission Request (HARQ) scheme and Adaptive Modulation and Coding (AMC) scheme as well as the use of the LDPC codes. To use the HARQ scheme and the AMC scheme, the communication system should support various coding rates.

As described above, for a high-speed, high-capacity data transmission/reception, the communication system positively considers the use of schemes supporting various coding rates, like HARQ and AMC, together with the use of the LDPC codes. However, the LDPC code is limited in its possible coding rates due to such restrictions as cyclic structure in a bipartite graph and complex hardware implementation thereof. Therefore, there is a need for a scheme of transmitting/receiving signals using an LDPC code at various supportable coding rates without an increase in the number of encoders and decoders in the communication system.

SUMMARY OF THE INVENTION

It is, therefore, an object of the present invention to provide an apparatus and method for transmitting/receiving signals in a communication system using an LDPC code.

It is another object of the present invention to provide an apparatus and method for transmitting/receiving signals at various supportable coding rates in a communication system using an LDPC code.

It is a further object of the present invention to provide a method for generating a parity check matrix for supporting various coding rates in a communication system using an LDPC code.

According to one aspect of the present invention, there is provided a signal transmission apparatus of a communication system. The signal transmission apparatus includes an encoder for encoding an information vector into a low density parity check (LDPC) codeword with an LDPC coding scheme; and a puncturer for puncturing the LDPC codeword according to a coding rate using a puncturing scheme.

According to another aspect of the present invention, there is provided a signal reception apparatus of a communication system. The signal reception apparatus includes a '0' inserter for inserting '0' symbols in a received signal according to a coding rate used in the signal transmission apparatus; and a decoder for decoding the '0' symbol-inserted signal with a decoding scheme corresponding to a low density parity check (LDPC) coding scheme used in the signal transmission apparatus, thereby detecting an information vector.

According to a further aspect of the present invention, there is provided a method for transmitting/receiving a signal in a signal transmission apparatus of a communication system. The method includes encoding an information vector into a low density parity check (LDPC) codeword with an LDPC coding scheme; and puncturing the LDPC codeword according to a coding rate using a puncturing scheme.

According to yet another aspect of the present invention, there is provided a method for receiving a signal in a signal reception apparatus of a communication system. The method includes inserting '0' symbols in a received signal according to a coding rate used in a signal transmission apparatus; and decoding the '0' symbol-inserted signal with a decoding scheme corresponding to a low density parity check (LDPC) coding scheme used in the signal transmission apparatus, thereby detecting an information vector.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides an apparatus and method for transmitting/receiving signals in a communication system using Low Density Parity Check (LDPC) code. In addition, the present invention provides an apparatus and method for transmitting/receiving signals at various supportable coding rates in a communication system using LDPC code. It will be assumed herein that a puncturing scheme is used to support various coding rates.

Design of an LDPC code supporting various coding rates, like the design of a general LDPC code, is implemented through design of a parity check matrix. However, in order to provide an LDPC code supporting various coding rates using one encoder, a parity check matrix capable of representing the LDPC code corresponding to different coding rates should be included in the parity check matrix. A typical scheme for supporting more than 2 coding rates using one parity check matrix is the puncturing scheme.

The puncturing scheme increases the coding rate by transmitting only a part of a generated parity vector, instead of transmitting the entire parity vector of an LDPC codeword, i.e. a codeword vector, output from an encoder. When the puncturing scheme is used, the initially provided encoder and decoder can be used as they are for coding and decoding. That is, the puncturing scheme is high in its reliability because coding complexity and decoding complexity are almost constant regardless of the coding rate and the length of the codeword vector, and the coding rate is varied by fixing the length of the information vector and varying only the length of the parity vector. However, because the LDPC code generated using the puncturing scheme may differ in its performance according to its puncturing pattern, performance depends on design of the puncturing pattern. Therefore, the present invention proposes a puncturing pattern corresponding to a coding rate, and also proposes an apparatus and method for puncturing an LDPC codeword using the puncturing scheme according to the puncturing pattern before transmission/reception, thereby improving performance.

A description will now be made of a method for generating a parity check matrix according to the present invention.

Figure 1:
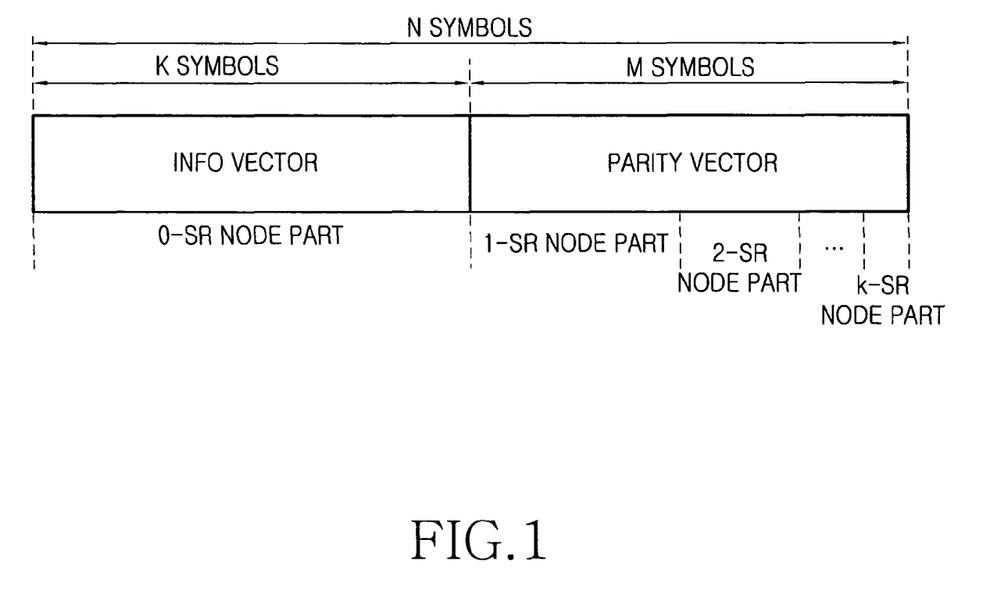
FIG. 1 is a diagram of the structure of a codeword vector according to the present invention.

Referring to FIG. 1, if it is assumed that the length of a codeword vector corresponds to N symbols, the length of an information vector corresponds to N symbols, and the target coding rate is denoted by $R_p$, then the number $N_p$ of symbols to be punctured can be expressed as Equation (1):

$$N_P = \left| N - \frac{K}{R_P} + 0.5 \right| \qquad (1)$$

Assuming that for an arbitrary LDPC code, $N_p$ symbols are punctured from an N-symbol codeword vector, a k-step recoverable (k-SR) node will be defined. The k-SR node will be described herein below with reference to FIGS. 2 and 3.

Figure 2:
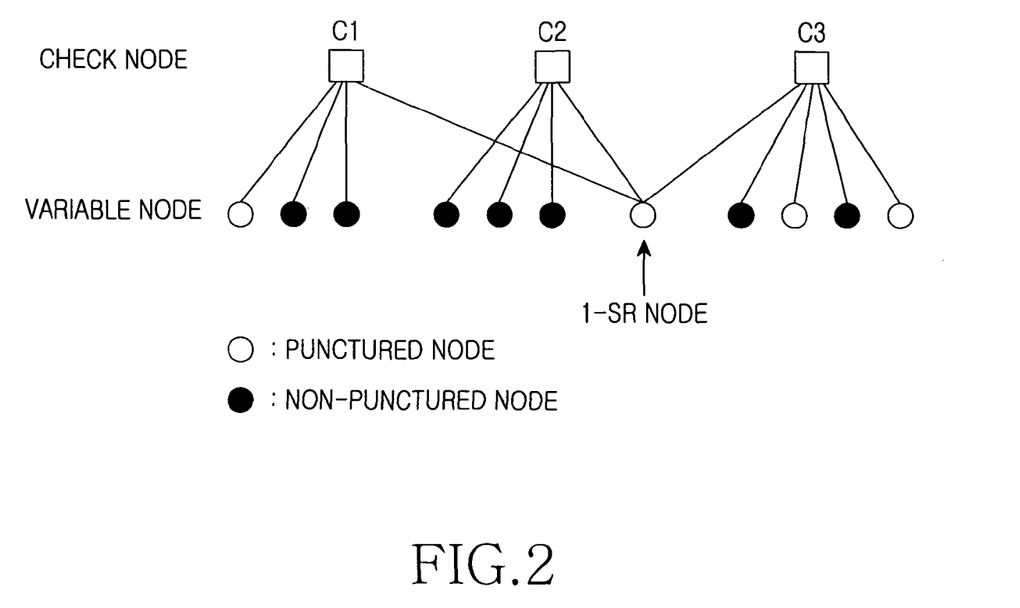
FIG. 2 is a diagram of a 1-step recoverable (1-SR) node in a bipartite graph according to the present invention.

With reference to FIG. 2, a description will first be made of a 1-step recoverable (1-SR) node according to the present invention.

Referring to FIG. 2, a 1-SR node is a variable node; except for the 1-SR node itself at least one of its neighbor check nodes is defined as a node connected to non-punctured variable nodes. The non-punctured variable nodes are defined as 0-SR nodes, and the term "non-punctured variable node" refers to a variable node that is not punctured. As a result, the 1-SR node indicates a node that can be recovered through one iteration by an iterative decoding scheme.

Next, with reference to FIG. 3, a description will be made of a k-SR node according to the present invention.

Figure 3:
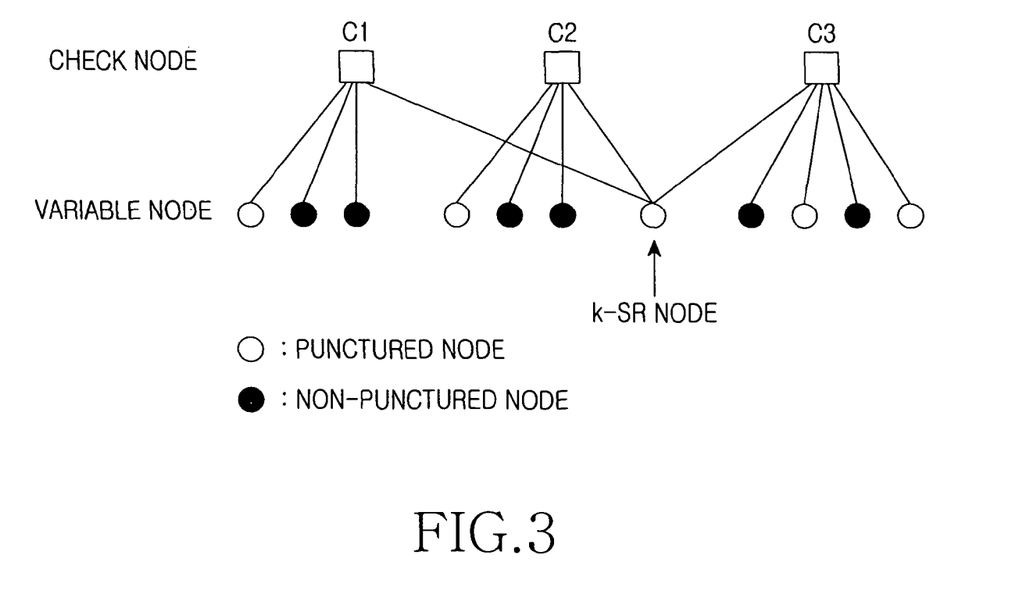
FIG. 3 is a diagram of a k-step recoverable (k-SR) node in a bipartite graph according to the present invention.

Referring to FIG. 3, a k-SR node is a variable node; except for the k-SR node itself at least one of its neighbor check nodes, includes one (k−1)-SR node, and the remaining nodes are defined as nodes, each composed of 0~(k−1)-SR nodes. As a result, the k-SR node represents a node that can be recovered through k iterations by the iterative decoding scheme.

As a result, the codeword vector shown in FIG. 1 includes information vector, i.e. a 0-SR node part including 0-SR nodes, and a parity vector, i.e. a 1-SR node part including 1-SR nodes through a k-SR parity part including k-SR nodes.

In addition, the embodiment of the present invention generates a parity check matrix of an LDPC code taking the k-SR nodes into account, and a description thereof will be made herein below with reference to FIG. 4.

Figure 4:
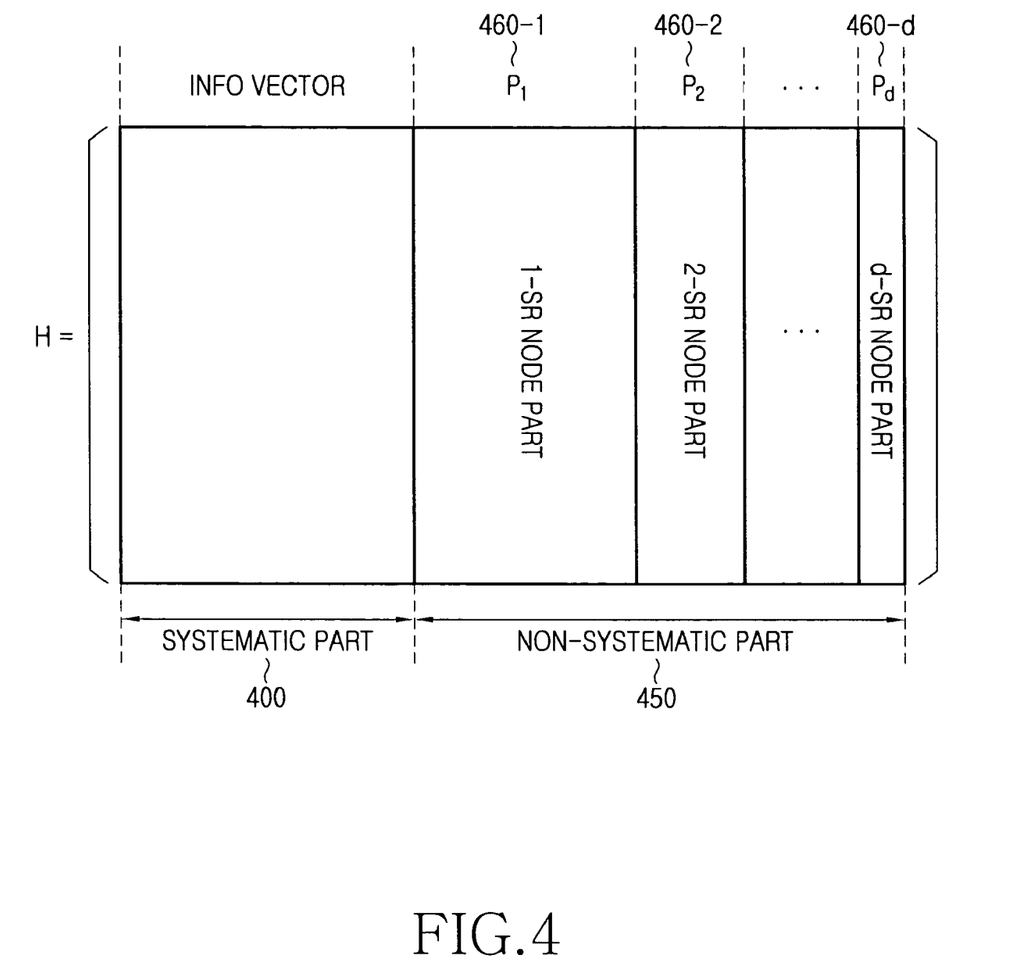
FIG. 4 is a diagram of a parity check matrix of an LDPC code according to the present invention.

Referring to FIG. 4, the parity check matrix H includes a systematic part 400 and a non-systematic part 450. The non-systematic part 450 includes a partial matrix $P_1$ 460-1 to a partial matrix $P_d$ 460-d. The partial matrix $P_1$ 460-1 is a matrix including 1-SR nodes, and the partial matrix $P_d$ 460-d is a matrix including d-SR nodes, where $d \geq 2$.

Assume that the parity check matrix H includes 2 partial matrixes $H_1$ and $H_2$ as shown in Equation (2) below.

$$H = [H_1 | H_2] \qquad (2)$$

In Equation (2), the partial matrix $H_1$ indicates a matrix corresponding to the systematic part 400, and the partial matrix $H_2$ indicates a matrix corresponding to the non-systematic part 450.

The partial matrix $H_2$ can be expressed as Equation (3):

$$H_2 = [P_1 | P_2 | P_3 | \ldots | P_{d-1} | P_d] \qquad (3)$$

It is assumed herein that the number of symbols of a codeword vector generated by the parity check matrix H is N, the number of symbols of an information vector included in the codeword vector is K, and the number of parity vector symbols is M. Therefore, the coding rate R of a codeword vector generated by the parity check matrix H is $$R = \frac{K}{N}.$$

After the parity check matrix H is generated, parity symbols are punctured beginning at the parity symbols corresponding to the partial matrix $P_1$, which is representative of a 1-SR node part among the partial matrixes included in the non-systematic part 450 of the parity check matrix H. Matrix H is a function of the coding rate desired by the communication system. After the puncturing of the partial matrix $P_1$ is completed, parity symbols corresponding to both the partial matrix $P_1$ and the partial matrix $P_2$ are punctured. In this manner, parity symbols corresponding to the corresponding partial matrixes are punctured until the target coding rate is obtained.

Next, with reference to FIGS. 5 and 6, a description will be made of a structure of a partial matrix $H_2$ of a mother parity check matrix according to the present invention.

Figure 5:
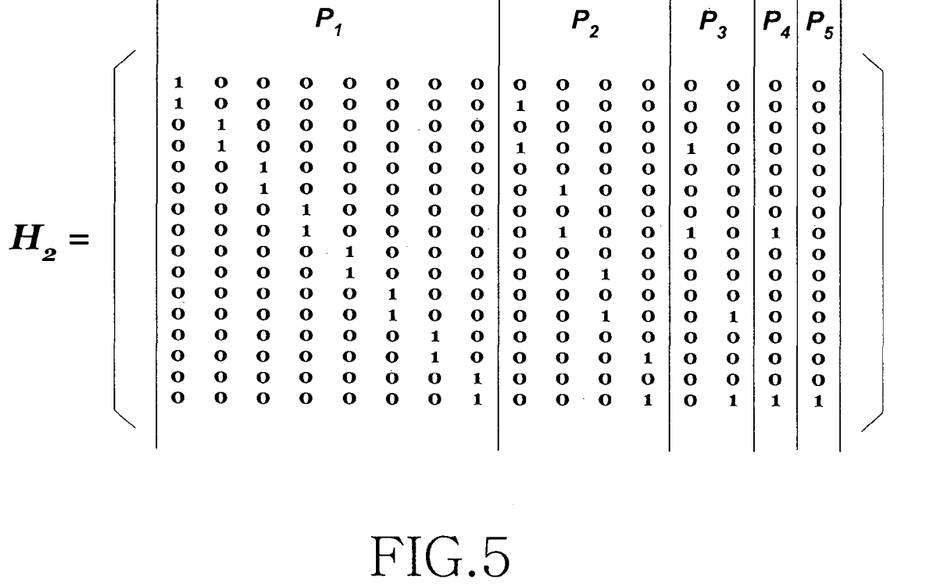
FIG. 5 is a diagram of a structure of a partial matrix $H_2$ of a mother parity check matrix according to the present invention.

The structure of the partial matrix $H_2$ shown in FIG. 5 is a structure given for the case where the number M of parity vector symbols is 16 (M=16), and includes a total of 5 matrixes, i.e. partial matrixes $P_1$ to $P_5$. In the partial matrix $H_2$, a $j^{th}$ column $h_{k,j}$ of a partial matrix corresponding to a k-SR node part (hereinafter referred to as a 'k-SR matrix'), i.e.

partial matrix $P_k$, can be expressed as Equation (4) and Equation (5) below.

$$h_{k,j} = D^{2^k j}[D^{2^{k-1}-1}(1+D^{2^{k-1}})] \quad (4)$$

In Equation (4), $$1 \leq k \leq d, 0 \leq j \leq \frac{M}{2^k} - 1,$$

and $D^i$ denotes a matrix where non-zero elements have a position i, where $0 \leq i \leq M-1$.

$$h_k = D^{M-1} \quad (5)$$

where k=d+1.

Figure 6:
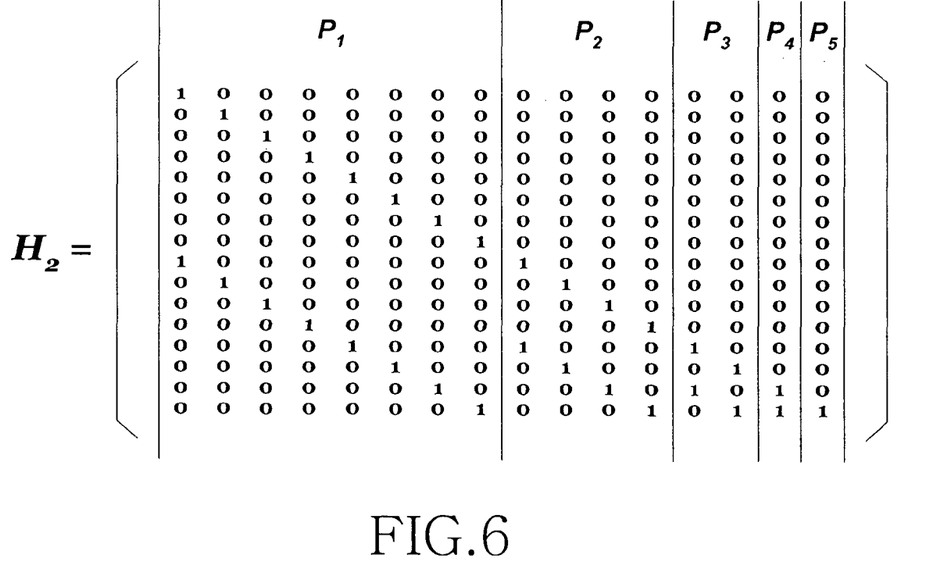
FIG. 6 is a diagram of a structure of a partial matrix $H_2$ of a parity check matrix according to the present invention.

When the partial matrix $P_k$ undergoes column permutation and row permutation, the structure of the partial matrix $H_2$ shown in FIG. 5 can be transformed into the structure of a partial matrix $H_2$ shown in FIG. 6.

It can be noted that the structure of the partial matrix $H_2$ shown in FIG. 6 is generated by performing column permutation and row permutation on the structure of the partial matrix $H_2$ shown in FIG. 5, and is a lower triangular matrix. In the partial matrix $H_2$, a $j^{th}$ column $h_{k,j}$ of a partial matrix $P_k$ can be expressed as Equation (6) and Equation (7) below.

$$h_{k,j} = D^j(1 + D^{\frac{M}{2^k}-1}) \quad (6)$$

where $1 \leq k \leq d, 0 \leq j \leq \frac{M}{2^k} - 1.$ $$h_k = D^{M-1} \quad (7)$$

where k=d+1.

The structures of the partial matrixes $H_2$ shown in FIGS. 5 and 6 are structures given for the case where the number M of parity vector symbols is 16 (M=16), i.e. the number M of parity vector symbols is an exponential value of 2. However, if the number M of parity vector symbols is not an exponential value of 2, the structure of the partial matrix $H_2$ is different from the structures shown in FIGS. 5 and 6, and a detailed description thereof will be made herein below.

Figure 7:
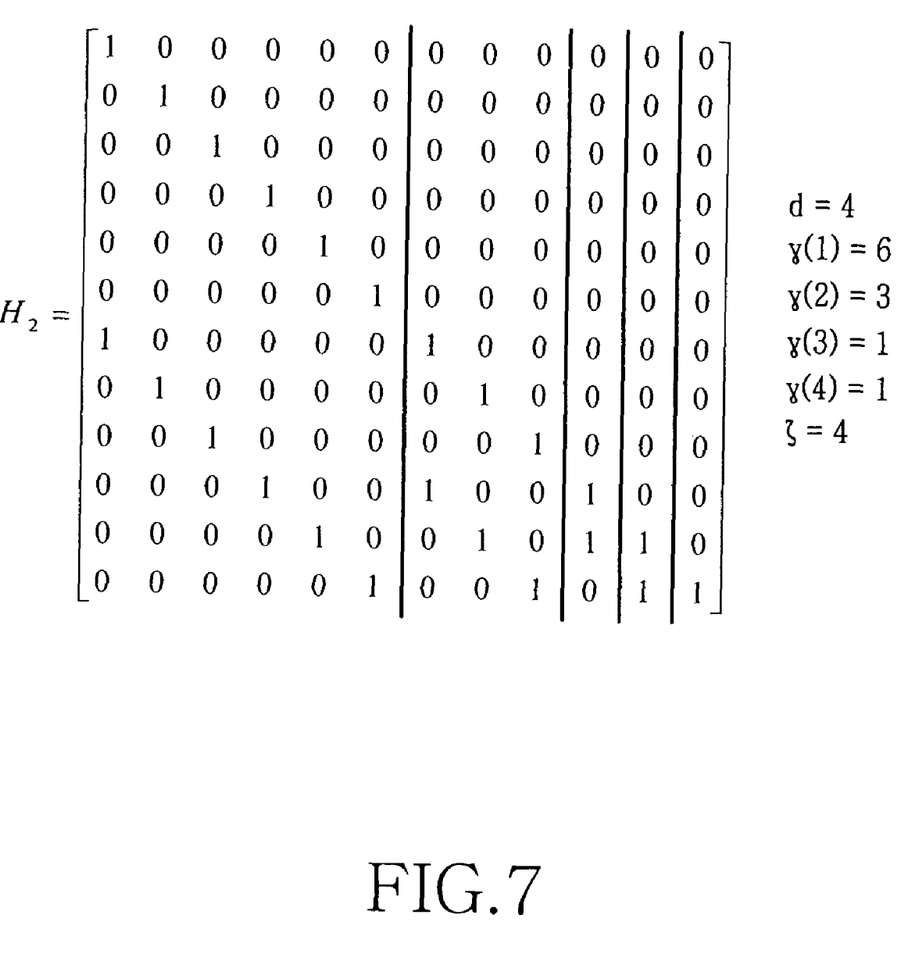
FIG. 7 is a diagram of another exemplary structure of a partial matrix $H_2$ of a parity check matrix according to the present invention.

A $j^{th}$ column $h_{k,j}$ of a k-SR matrix, i.e. partial matrix $P_k$, can be expressed as Equation (8) and Equation (9).

$$h_{k,j} = D^{j + \sum_{i=0}^{k-1} \gamma(i) - M}(1 + D^{\gamma(k)}) \quad (8)$$

where $1 \leq k \leq d, 0 \leq j \leq \gamma(k)-1$.

$$h_k = D^{M-1} \quad (9)$$

where k=d+1.

In Equation 8, $d = \lceil \log_2 M \rceil$, $\gamma(k)$ can be expressed as Equation (10), and its initial value is $\gamma(0)=M$.

$$\gamma(k) = \left\lfloor M - \frac{1}{2} \sum_{i=0}^{k-1} \gamma(i) \right\rfloor \quad (10)$$

In this case, the size of the k-SR matrix is $M \times \gamma(k)$, and for M=12, a structure of a partial matrix $H_2$ of a parity check matrix according to the present invention is shown in FIG. 7.

Now, with reference to FIG. 8, a description will be made of a structure of a signal transmission apparatus in a communication system according to the present invention.

Figure 8:
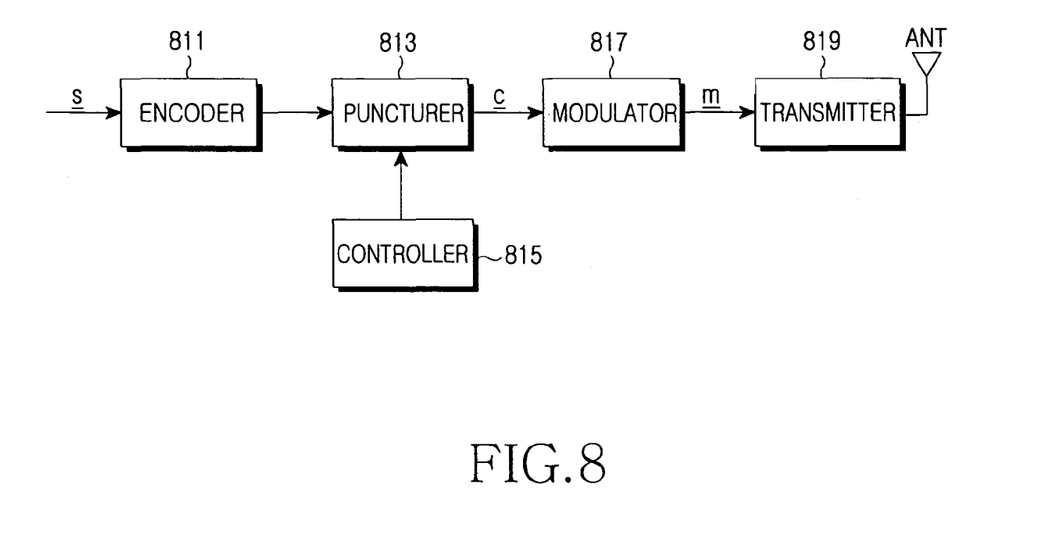
FIG. 8 is a diagram of a structure of a signal transmission apparatus in a communication system using an LDPC code according to the present invention.

Referring to FIG. 8, the signal transmission apparatus includes an encoder 811, a puncturer 813, a controller 815, a modulator 817, and a transmitter 819. Information data generated is delivered to encoder 811, i.e. information vector s, that the signal transmission apparatus desires to transmit. Encoder 811 encodes the information vector s into a codeword vector c, i.e. LDPC codeword, using a preset coding scheme, and outputs the codeword vector c to puncturer 813. For the coding scheme, LDPC is used, which performs coding according to a parity check matrix including the partial matrix $H_2$ corresponding to the non-systematic part described in FIGS. 5 to 7. Puncturer 813 punctures the codeword vector c output from encoder 811 according to a corresponding coding rate under the control of controller 815, and outputs the result to modulator 817. An operation of controlling puncturer 813 by controller 815 will be described below.

Controller 815 controls puncturer 813 in such a way that puncturer 813 punctures parity symbols corresponding to a k-SR matrix in the partial matrix $H_2$ determined according to a coding rate targeted by the signal transmission apparatus, from the codeword vector c output from encoder 811, and then outputs the result to modulator 817.

Modulator 817 modulates the signal output from puncturer 813 into a modulation vector m using a preset modulation scheme, and outputs the modulation vector m to transmitter 819. Transmitter 819 performs transmission signal processing on the modulation vector m output from modulator 817, and transmits the resulting signal to a signal reception apparatus via an antenna ANT. Although not separately illustrated in FIG. 8, it is assumed that the information on the k-SR matrix in the parity check matrix corresponding to the parity symbols punctured by puncturer 813 is commonly recognized by the signal transmission apparatus and the signal reception apparatus.

Figure 9:
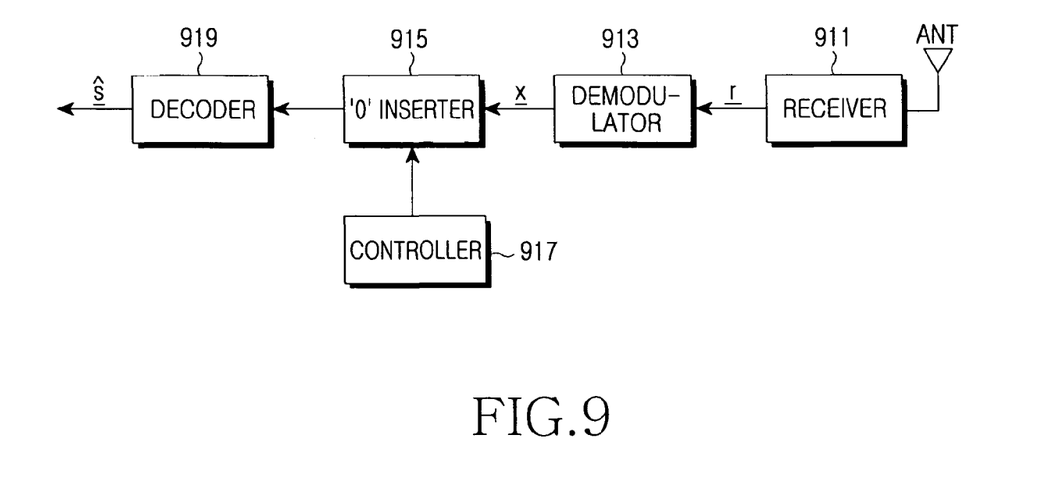
FIG. 9 is a diagram of a structure of a signal reception apparatus in a communication system using an LDPC code according to the present invention.

Now, with reference to FIG. 9, a description is made of the structure of a signal reception apparatus in a communication system using an LDPC code according to the present invention.

Referring to FIG. 9, the signal reception apparatus includes a receiver 911, a demodulator 913, a '0' inserter 915, a controller 917, and a decoder 919. A signal transmitted from a signal transmission apparatus is received via an antenna ANT of the signal reception apparatus, and the received signal is delivered to the receiver 911. Receiver 911 performs reception signal processing on the received signal, and outputs the processed received vector r to demodulator 913. Demodulator 913 demodulates the received vector r output from receiver 911 into a demodulation vector x using a preset demodulation scheme corresponding to the modulation scheme used in modulator 817 of the signal transmission apparatus, and outputs the demodulation vector x to '0' inserter 915. '0' inserter 915, under the control of controller 917, inserts '0' symbols in the demodulation vector x output from demodulator 913 according to the puncturing scheme used in puncturer 813 of the signal transmission apparatus, and outputs the resulting signal to decoder 919. Controlling the '0' insertion operation of '0' inserter 915 by controller 917 is described below.

Controller 917 controls '0' inserter 915 in such a way that '0' inserter 915 inserts '0' symbols in the demodulation vector x output from demodulator 913 at the position determined according to the coding rate targeted by the signal reception apparatus. The position where the '0' symbols are inserted is equal to the position of the parity symbols punctured from the codeword vector c.

Decoder 919 decodes the signal output from '0' inserter 915 using a decoding scheme corresponding to the coding scheme used in encoder 811 of the signal transmission apparatus, and then outputs the decoded signal as a finally restored information vector ŝ. For the decoding scheme, i.e. LDPC decoding scheme, a sum-product algorithm-based iterative decoding algorithm is used.

As can be understood from the foregoing description, the present invention enables the transmission/reception signals at various supportable coding rates in a communication system using an LDPC code. In addition, the present invention supports various coding rates by using the puncturing scheme in the communication system employing an LDPC code, thereby making it possible to transmit/receive signals with minimized hardware complexity. Further, the present invention newly provides a puncturing pattern for the puncturing scheme used for supporting various coding rates, thereby improving performance of the punctured LDPC codeword.

While the invention has been shown and described with reference to a certain preferred embodiment thereof, it will be understood by those skilled in the art that various changes in form and details may be made therein without departing from the spirit and scope of the invention as further defined by the appended claims.

What is claimed is:

1. A method for transmitting/receiving a signal in a signal transmission apparatus of a communication system, the method comprising:
encoding an information vector into a low density parity check (LDPC) codeword with an LDPC coding scheme; and
puncturing the LDPC codeword using a puncturing scheme that includes a puncturing pattern based on a plurality of coding rates and based on the number of iterations needed to recover one or more step-recoverable (SR) nodes included in the LDPC codeword.

2. The method of claim 1, further comprising transmitting the punctured LDPC codeword.

3. The method of claim 1, wherein the LDPC coding scheme is a scheme for encoding the information vector into the LDPC codeword according to a parity check matrix; and
wherein the parity check matrix includes a systematic part corresponding to an information vector and a non-systematic part corresponding to a parity vector, and the non-systematic part includes at least k partial matrixes.

4. The method of claim 3, wherein one of the partial matrixes corresponds to a k-SR node part including k-step recoverable (k-SR) nodes where $1 \leq k \leq d+1$, and the k-SR node is a variable node where at least one of its neighbor check nodes includes one (k-1)-SR node except for the k-SR node itself, and the remaining nodes are composed of 0~(k-1)-SR nodes.

5. The method of claim 4, wherein puncturing the LDPC codeword according to a coding rate using a puncturing scheme comprises:
sequentially puncturing parity symbols from a parity vector included in the LDPC codeword starting from a parity symbol corresponding to a first partial matrix to a parity symbol corresponding to a $k^{th}$ partial matrix, which corresponds to a k-SR node part whose k value has a minimum value to the partial matrix corresponding to a k-SR node part whose k value has a maximum value, until the coding rate is obtained.

6. The method of claim 5, wherein if the number M of symbols included in the parity vector has an exponential value of 2, a $j^{th}$ column $h_{k,j}$ of a $k^{th}$ partial matrix is expressed as follows, $$h_{k,j}=D^{2^k j}[D^{2^{k-1}-1}(1+D^{2^{k-1}})]$$

where $$1 \leq k \leq d, 0 \leq j \leq \frac{M}{2^k} - 1,$$

and $D^i$ denotes a matrix where non-zero elements have a position i, where $0 \leq i \leq M-1$; and $$h_k = D^{M-1}$$

where k=d+1.

7. The method of claim 5, wherein if the number M of symbols included in the parity vector has an exponential value of 2, a $j^{th}$ column $h_{k,j}$ of a $k^{th}$ partial matrix is expressed as follows, $$h_{k,j} = D^j(1 + D^{\frac{M}{2^k}-1})$$

where $1 \leq k \leq d, 0 \leq j \leq \frac{M}{2^k} - 1,$ and $D^i$ denotes a matrix where non-zero elements have a position i, where $0 \leq i \leq M-1$; and $$h_k = D^{M-1}$$

where k=d+1.

8. The method of claim 5, wherein if the number M of symbols included in the parity vector does not have an exponential value of 2, a $j^{th}$ column $h_{k,j}$ of a $k^{th}$ partial matrix is expressed as follows, $$h_{k,j} = D^{j+\sum_{i=0}^{k-1} \gamma(i) - M}(1 + D^{\gamma(k)})$$

where $1 \leq k \leq d, 0 \leq j \leq \gamma(k)-1$; and $$h_k = D^{M-1}$$

where k=d+1;
where $d = \lceil \log_2 M \rceil$, $\gamma(k)$ is expressed as follows and its initial value is $\gamma(0)=M$, $$\gamma(k) = \left\lfloor M - \frac{1}{2}\sum_{i=0}^{k-1} \gamma(i) \right\rfloor.$$

9. A signal transmission apparatus of a communication system, the apparatus comprising:
an encoder for encoding an information vector into a low density parity check (LDPC) codeword with an LDPC coding scheme; and
a puncturer for puncturing the LDPC codeword using a puncturing scheme that includes a puncturing pattern based on a plurality of coding rates and based on the number of iterations needed to recover one or more step-recoverable (SR) nodes included in the LDPC codeword.

10. The signal transmission apparatus of claim 9, further comprising:
a transmitter for transmitting the punctured LDPC codeword; and
a controller for determining the puncturing scheme according to the coding rate, and controlling an operation of the puncturer.

11. The signal transmission apparatus of claim 9, wherein the LDPC coding scheme is a scheme for encoding the information vector into the LDPC codeword according to a parity check matrix, the parity check matrix includes a systematic part corresponding to an information vector and a non-systematic part corresponding to a parity vector, and the non-systematic part includes at least k partial matrixes.

12. The signal transmission apparatus of claim 11, wherein one of the partial matrixes corresponds to a k-SR node part including k-step recoverable (k-SR) nodes where $1 \leq k \leq d+1$, and the k-SR node is a variable node where at least one of its neighbor check nodes includes one (k−1)-SR node except for the k-SR node itself, and the remaining nodes are composed of 0~(k−1)-SR nodes.

13. The signal transmission apparatus of claim 12, wherein the controller controls the puncturer so as to sequentially puncture parity symbols from a parity vector included in the LDPC codeword starting from a parity symbol corresponding to a first partial matrix to a parity symbol corresponding to a $k^{th}$ partial matrix among the first partial matrix corresponding to a k-SR node part whose k value has a minimum value to the $k^{th}$ partial matrix corresponding to a k-SR node part whose k value has a maximum value, until the coding rate is obtained.

14. The signal transmission apparatus of claim 13, wherein if the number M of symbols included in the parity vector has an exponential value of 2, a $j^{th}$ column $h_{k,j}$ of a $k^{th}$ partial matrix is expressed as follows, $$h_{k,j} = D^{2^k j} [D^{2^{k-1}-1}(1+D^{2^{k-1}})]$$

where $$1 \leq k \leq d, \ 0 \leq j \leq \frac{M}{2^k} - 1,$$

and $D^i$ denotes a matrix where non-zero elements have a position i, where $0 \leq i \leq M-1$; and $$h_k = D^{M-1}$$

where k=d+1.

15. The signal transmission apparatus of claim 13, wherein if the number M of symbols included in the parity vector has an exponential value of 2, a $j^{th}$ column $h_{k,j}$ of a $k^{th}$ partial matrix is expressed as follows, $$h_{k,j} = D^j(1 + D^{\frac{M}{2^k}-1})$$

where $1 \leq k \leq d, \ 0 \leq j \leq \frac{M}{2^k} - 1,$ $D^i$ denotes a matrix where non-zero elements have a position i where $0 \leq i \leq M-1$, and M denotes the number of symbols included in the parity vector; and $$h_k = D^{M-1}$$

where k=d+1.

16. The signal transmission apparatus of claim 13, wherein if the number M of symbols included in the parity vector does not have an exponential value of 2, a $j^{th}$ column $h_{k,j}$ of a $k^{th}$ partial matrix is expressed as follows, $$h_{k,j} = D^{j + \sum_{i=0}^{k-1} \gamma(i) - M}(1 + D^{\gamma(k)})$$

where $1 \leq k \leq d$, $0 \leq j \leq \gamma(k)-1$; and $$h_k = D^{M-1}$$

where k=d+1;

where $d = \lceil \log_2 M \rceil$, $\gamma(k)$ is expressed as follow, and its initial value is $\gamma(0)=M$, $$\gamma(k) = \left\lfloor M - \frac{1}{2}\sum_{i=0}^{k-1} \gamma(i) \right\rfloor.$$

17. A method for receiving a signal in a signal reception apparatus of a communication system, the method comprising:
receiving an LDPC codeword having a puncturing scheme that includes a puncturing pattern based on a plurality of coding rates and based on the number of iterations needed to recover one or more step-recoverable (SR) nodes included in the LDPC codeword;
inserting '0' symbols in a received signal in a pattern based on the puncturing pattern of the received LDPC codeword; and
decoding the '0' symbol-inserted signal with a decoding scheme corresponding to a low density parity check (LDPC) coding scheme used in the signal transmission apparatus, thereby detecting an information vector.

18. The method of claim 17, wherein the LDPC coding scheme is a scheme for encoding the information vector into the LDPC codeword according to a parity check matrix, the parity check matrix includes a systematic part corresponding to an information vector and a non-systematic part corresponding to a parity vector, and the non-systematic part includes at least k partial matrixes.

19. The method of claim 18, wherein one of the partial matrixes corresponds to a k-SR node part including k-step recoverable (k-SR) nodes where $1 \leq k \leq d+1$, and the k-SR node is a variable node where at least one of its neighbor check nodes includes one (k−1)-SR node except for the k-SR node itself, and the remaining nodes are composed of 0~(k−1)-SR nodes.

20. The method of claim 19, wherein the step of inserting '0' symbols in a received signal according to a coding rate comprises inserting '0' symbols in a position of parity symbols punctured from an LDPC codeword by the signal transmission apparatus according to the coding rate.

21. The method of claim 20, wherein the position of the punctured parity symbols is a position of parity symbols punctured from the LDPC codeword until the coding rate is obtained.

22. The method of claim 20, wherein the punctured parity symbols are parity symbols that sequentially correspond to a $k^{th}$ partial matrix starting from a parity symbol corresponding to a first partial matrix, which corresponds to a k-SR node part whose k value has a minimum value to the $k^{th}$ partial matrix corresponding to a k-SR node part whose k value has a maximum value in the parity vector included in the LDPC codeword, punctured until the coding rate is obtained.

23. The method of claim 20, wherein if the number M of symbols included in the parity vector has an exponential value of 2, a $j^{th}$ column $h_{k,j}$ of a $k^{th}$ partial matrix is expressed as follows, $$h_{k,j} = D^{2^k j}[D^{2^{k-1}-1}(1+D^{2^{k-1}})]$$

where $$1 \leq k \leq d, \ 0 \leq j \leq \frac{M}{2^k} - 1,$$

and $D^i$ denotes a matrix where non-zero elements have a position i, where $0 \leq i \leq M-1$; and $$h_k = D^{M-1}$$

where k=d+1.

24. The method of claim 20, wherein if the number M of symbols included in the parity vector has an exponential value of 2, a $j^{th}$ column $h_{k,j}$ of a $k^{th}$ partial matrix is expressed as follows, $$h_{k,j} = D^j(1+D^{\frac{M}{2^k}-1})$$

where $1 \le k \le d, 0 \le j \le \frac{M}{2^k} - 1$, and $D^i$ denotes a matrix where non-zero elements have a position i, where $0 \le i \le M-1$; and $$h_k = D^{M-1}$$

where k=d+1.

25. The method of claim 20, wherein if the number M of symbols included in the parity vector does not have an exponential value of 2, a $j^{th}$ column $h_{k,j}$ of a $k^{th}$ partial matrix is expressed as follows, $$h_{k,j} = D^{j+\sum_{i=0}^{k-1}\gamma(i)-M}(1+D^{\gamma(k)})$$

where $1 \le k \le d$, $0 \le j \le \gamma(k)-1$; and $$h_k = D^{M-1}$$

where k=d+1;
where $d = \lceil \log_2 M \rceil$, $\gamma(k)$ is expressed as follows, and its initial value is $\gamma(0)=M$, $$\gamma(k) = \left\lfloor M - \frac{1}{2}\sum_{i=0}^{k-1}\gamma(i) \right\rfloor.$$

26. A signal reception apparatus of a communication system, the apparatus comprising:
a receiver for receiving an LDPC codeword having a puncturing scheme that includes a puncturing pattern based on a plurality of coding rates and based on the number of iterations needed to recover one or more step-recoverable (SR) nodes included in the LDPC codeword;
a '0' inserter for inserting '0' symbols in a received signal in a pattern based on the puncturing pattern of the received LDPC codeword; and
a decoder for decoding the '0' symbol-inserted signal with a decoding scheme corresponding to a low density parity check (LDPC) coding scheme used in the signal transmission apparatus, thereby detecting an information vector.

27. The signal reception apparatus of claim 26, further comprising a controller for controlling a position where the '0' symbols are inserted according to the coding rate.

28. The signal reception apparatus of claim 27, wherein the LDPC coding scheme is a scheme for encoding the information vector into the LDPC codeword according to a parity check matrix, the parity check matrix includes a systematic part corresponding to an information vector and a non-systematic part corresponding to a parity vector, and the non-systematic part includes at least k partial matrixes.

29. The signal reception apparatus of claim 28, wherein one of the partial matrixes corresponds to a k-SR node part including k-step recoverable (k-SR) nodes where $1 \le k \le d+1$, and the k-SR node is a variable node where at least one of its neighbor check nodes includes one (k-1)-SR node except for the k-SR node itself, and the remaining nodes are composed of 0~(k-1)-SR nodes.

30. The signal reception apparatus of claim 29, wherein the controller controls the '0' inserter so as to insert '0' symbols in a position of parity symbols punctured from an LDPC codeword by the signal transmission apparatus according to the coding rate.

31. The signal reception apparatus of claim 30, wherein the position of the punctured parity symbols is a position of parity symbols punctured from the LDPC codeword until the coding rate is obtained.

32. The signal reception apparatus of claim 30, wherein the punctured parity symbols are parity symbols that sequentially correspond to a $k^{th}$ partial matrix starting from a parity symbol corresponding to a first partial matrix, which corresponds to a k-SR node part whose k value has a minimum value to the $k^{th}$ partial matrix corresponding to a k-SR node part whose k value has a maximum value in the parity vector included in the LDPC codeword, punctured until the coding rate is obtained.

33. The signal reception apparatus of claim 32, wherein if the number M of symbols included in the parity vector has an exponential value of 2, a $j^{th}$ column $h_{k,j}$ of a $k^{th}$ partial matrix is expressed as follows, $$h_{k,j}=D^{2^k j}[D^{2^{k-1}-1}(1+D^{2^{k-1}})]$$

where $$1 \le k \le d, 0 \le j \le \frac{M}{2^k} - 1,$$

and $D^i$ denotes a matrix where non-zero elements have a position i, where $0 \le i \le M-1$; and $$h_k = D^{M-1}$$

where k=d+1.

34. The signal reception apparatus of claim 32, wherein if the number M of symbols included in the parity vector has an exponential value of 2, a $j^{th}$ column $h_{k,j}$ of a $k^{th}$ partial matrix is expressed as follows, $$h_{k,j} = D^j\left(1+D^{\frac{M}{2^k}-1}\right) \text{ where } 1 \le k \le d, 0 \le j \le \frac{M}{2^k} - 1,$$

and $D^i$ denotes a matrix where non-zero elements have a position i, where $0 \le i \le M-1$; and $$h_k = D^{M-1}$$

where k=d+1.

35. The signal reception apparatus of claim 32, wherein if the number M of symbols included in the parity vector does not have an exponential value of 2, a $j^{th}$ column $h_{k,j}$ of a $k^{th}$ partial matrix is expressed as follows, $$h_{k,j} = D^{j+\sum_{i=0}^{k-1}\gamma(i)-M}(1+D^{\gamma(k)})$$

where $1 \le k \le d$, $0 \le j \le \gamma(k)-1$; and $$h_k = D^{M-1}$$

where k=d+1;
where $d = \lceil \log_2 M \rceil$, $\gamma(k)$ is expressed as follows and its initial value is $\gamma(0)=M$, $$\gamma(k) = \left\lfloor M - \frac{1}{2}\sum_{i=0}^{k-1}\gamma(i) \right\rfloor.$$

* * * * *